(12) United States Patent
Tsunai et al.

(10) Patent No.: US 6,784,742 B2
(45) Date of Patent: Aug. 31, 2004

(54) VOLTAGE AMPLIFYING CIRCUIT

(75) Inventors: Shiro Tsunai, Tokyo (JP); Akira Uemura, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/189,140

(22) Filed: Jul. 3, 2002

(65) Prior Publication Data

US 2003/0006843 A1 Jan. 9, 2003

(30) Foreign Application Priority Data

Jul. 5, 2001 (JP) ........................................ 2001-204367

(51) Int. Cl.[7] .................................................. H03G 3/10
(52) U.S. Cl. ........................ 330/284; 330/281; 330/141
(58) Field of Search ................................. 330/278, 281, 330/282, 284, 141, 144, 285; 327/112, 308, 324, 434, 313, 318

(56) References Cited

U.S. PATENT DOCUMENTS 6,285,257 B1 * 9/2001 Abe et al. ................... 330/282
6,437,646 B2 * 8/2002 Masahiro ..................... 330/284

* cited by examiner

Primary Examiner—Long Nguyen
(74) Attorney, Agent, or Firm—Darryl G. Walker; Bradley T. Sako

(57) ABSTRACT

A voltage amplifying circuit (100) that may have a selectable gain has been disclosed. Voltage amplifying circuit (100) may include a voltage amplifier (2) and a gain changing unit (7). A gain changing unit (2) may be capable of changing at least one of: a capacitance between a signal input terminal (6) and an input terminal of a voltage amplifier, the capacitance between an input terminal of a voltage amplifier and a ground (or reference potential), and a capacitance between an input and an output terminal (3) of a voltage amplifier. In this way, a gain from a signal input terminal (6) to an output terminal (3) of a voltage amplifier of a voltage amplifying circuit (100) may be changed.

13 Claims, 8 Drawing Sheets

VOLTAGE AMPLIFYING CIRCUIT

TECHNICAL FIELD

The present invention relates generally to a voltage amplifying circuit, and more particularly to a voltage amplifying circuit that may be capable of having a selectable gain among a plurality of gain values.

BACKGROUND OF THE INVENTION

Referring to FIG. 7, a circuit schematic diagram of a conventional voltage amplifying circuit is set forth and given the general reference character 700.

Conventional voltage amplifying circuit 700 has a signal input terminal 106, gain changing terminal 108, and a clamp pulse input terminal 109. Conventional voltage amplifying circuit 700 also has a signal output terminal 103.

Conventional voltage amplifying circuit 700 includes power supplies (101a and 101b), voltage amplifiers (102a and 102b), voltage clamp switches (104a and 104b), clamp voltage sources (105a and 105b), inverters (110 to 112), gain changing switches (113 and 114), and capacitors (C101 to C103).

Voltage amplifier 102a includes n-type MOS (metal-oxide-semiconductor) transistors (120a and 121a). Voltage amplifier 102b includes n-type MOS transistors (120b and 121b). Voltage amplifiers (102a and 102b) have identical gains.

Gain changing switches (113 and 114) are n-type MOS transistors.

Because a capacitor C102 is disposed between a gate of n-type MOS transistor 120a and ground, a gain of a signal from signal input terminal 106 to a signal output terminal 103 through voltage amplifier 102a is smaller than the gain of a signal from signal input terminal 106 to signal output terminal 103 through voltage amplifier 102b.

When a high voltage (such as 5 volts) is applied to gain changing terminal 108, gain changing switch 113 turns off and gain changing switch 114 turns on. Thus, a voltage gain path from signal input terminal 106 to signal output terminal 103 through voltage amplifier 102b is selected and the gain of conventional voltage amplify circuit 700 becomes high. When a low voltage (such as 0 volts) is applied to gain changing terminal 108, gain changing switch 114 turns off and gain changing switch 113 turns on. Thus, a voltage gain path from signal input terminal 106 to signal output terminal 103 through voltage amplifier 102a is selected and the gain of conventional voltage amplify circuit 700 becomes low. In this way, the gain of conventional voltage amplifying circuit 700 can be selected or changed over.

Referring now to FIG. 8, a circuit schematic diagram of a conventional voltage amplifying circuit is set forth and given the general reference character 800.

Conventional voltage amplifying circuit 800 has a signal input terminal 206, gain changing terminal 208, and a clamp pulse input terminal 209. Conventional voltage amplifying circuit 800 also has a signal output terminal 203.

Conventional voltage amplifying circuit 800 includes power supplies (201a and 201b), voltage amplifiers (202a and 202b), voltage clamp switches (204a and 204b), clamp voltage sources (205a and 205b), inverters (210 to 212), gain changing switches (213 and 214), and capacitors (C201 and C202).

Voltage amplifier 202a includes n-type MOS transistors (220a and 221a). Voltage amplifier 202b includes n-type MOS transistors (220b and 221b). Voltage amplifier 202a has a gain that is larger than voltage amplifier 202b. FIG. 9 is a graph illustrating voltage transfer characteristics of voltage amplifiers (202a and 202b). The gain can be ascertained by the slope of the transfer characteristics. As illustrated in FIG. 9, voltage amplifier 202a has a higher gain than voltage amplifier 202b.

Referring once again to FIG. 8, when a high voltage (such as 5 volts) is applied to gain changing terminal 208, gain changing switch 213 turns off and gain changing switch 214 turns on. Thus, a voltage gain path from signal input terminal 206 to signal output terminal 203 through voltage amplifier 202b is selected and the gain of conventional voltage amplify circuit 800 becomes low. When a low voltage (such as 0 volts) is applied to gain changing terminal 208, gain changing switch 214 turns off and gain changing switch 213 turns on. Thus, a voltage gain path from signal input terminal 206 to signal output terminal 203 through voltage amplifier 202a is selected and the gain of conventional voltage amplify circuit 800 becomes high. In this way, the gain of conventional voltage amplifying circuit 800 can be selected or changed over.

Referring now to FIG. 10, a circuit schematic diagram of yet another conventional voltage amplifying circuit is set forth and given the general reference character 1000.

Conventional voltage amplifying circuit 1000 has a signal input terminal 306, gain changing terminal 308, and a clamp pulse input terminal 309. Conventional voltage amplifying circuit 1000 also has a signal output terminal 303.

Conventional voltage amplifying circuit 1000 includes a power supply 301, a voltage amplifier 302, a voltage clamp switch 304, a clamp voltage source 305, inverters (310 and 311), and a capacitor C301.

Voltage amplifier 302 includes n-type MOS transistors (320 to 322).

In voltage amplifier 302, n-type MOS transistors (320 and 321) are used as resistors or loads. N-type MOS transistor 321 is turned on or off to select or change over the gain.

When a high voltage (such as 5 volts) is applied to gain changing terminal 308, n-type MOS transistor 321 turns off. Thus, the gain of conventional voltage amplify circuit 1000 becomes low. When a low voltage (such as 0 volts) is applied to gain changing terminal 308, n-type MOS transistor 321 turns on. Thus, the gain of conventional voltage amplify circuit 1000 becomes high. In this way, the gain of conventional voltage amplifying circuit 1000 can be selected or changed over.

In conventional voltage amplifying circuit 700 of FIG. 7, even the operating speed may not change for the two selectable gains because both voltage amplifiers (102a and 102b) have the same gain. However, in conventional voltage amplifying circuit 800 of FIG. 8, the operating speed can differ when the gain is changed over because voltage amplifiers (202a and 202b) have different gains. In conventional amplifying circuits (700 and 800), the circuit size can be relative large because two voltage amplifiers are used. Also, because two voltage amplifiers are used and enabled at all times (an output from one of the two voltage amplifiers is selected), power consumption is relatively large.

On the contrary, conventional voltage amplifying circuit 1000 uses only one voltage amplifier. Thus, the circuit area and power consumption may be reduced as compared with conventional voltage amplifying circuits (700 and 800). However, in conventional voltage amplifying circuit 1000, the amount of current flowing in voltage amplifier 302 varies in accordance with whether n-type MOS transistor 321 is on or off. The change in current causes change in operating speeds and power consumption. The operating speed and power consumption changes more as the gain variation ratio (ratio of the high gain to the low gain) becomes larger. Therefore, conventional voltage amplifying circuit 1000 may be effective for a case where there is a small gain and a gain variation ratio is only about two. However, for large gains and large gain ratios, the power consumption may be large and the operation speed differences may be relatively large.

In view of the above discussion, it would be desirable to provide a voltage amplifying circuit, which may have a reduced circuit area and/or power consumption. It would also be desirable to provide a voltage amplifying circuit in which operating speed variation and/or power consumption variation is suppressed when a gain is changed over or switched.

SUMMARY OF THE INVENTION

According to the present embodiments, a voltage amplifying circuit may have a selectable gain. A voltage amplifying circuit may include a voltage amplifier and a gain changing unit. A gain changing unit may be capable of changing at least one of: a capacitance between a signal input terminal and an input terminal of a voltage amplifier and a capacitance between an input terminal of a voltage amplifier and a ground or a first reference potential. In this way, a gain from a signal input terminal to an output terminal of a voltage amplifying circuit may be changed.

According to one aspect of the embodiments, a voltage amplifier may amplify an input signal received at a voltage amplifier input terminal and provide an output signal at a voltage amplifier output terminal.

According to another aspect of the embodiments, the gain changing circuit may include a first capacitor, a second capacitor, a first switch, and a second switch. The first capacitor may have a first terminal connected to a signal input terminal and a second terminal connected to a voltage amplifier input terminal. The second capacitor may have a first terminal connected to a voltage amplifier input terminal. The first switch may be coupled between a second terminal of the second capacitor and a first reference potential. The second switch may be connected between the signal input terminal and the second terminal of the second capacitor.

According to another aspect of the embodiments, the gain changing circuit may include a first capacitor, a second capacitor, a third capacitor, a first switch, a second switch, a third switch, and a fourth switch. The first capacitor may have a first terminal connected to a signal input terminal and a second terminal connected to a voltage amplifier input terminal. The second capacitor may have a first terminal connected to a voltage amplifier input terminal. The third capacitor may have a first terminal connected to the voltage amplifier input terminal. The first switch may be coupled between a second terminal of the second capacitor and a first reference potential. The second switch may be connected between the signal input terminal and the second terminal of the second capacitor. The third switch may be coupled between the signal input terminal and a second terminal of the third capacitor. The fourth switch may be coupled between the second terminal of the third capacitor and the first reference potential.

According to another aspect of the embodiments, a gain circuit may include a first capacitor, a second capacitor, a first switch, and a second switch. The first capacitor may have a first terminal connected to a signal input terminal and a second terminal connected to a voltage amplifier input terminal. The second capacitor may have a first terminal connected to a voltage amplifier input terminal. The first switch may be coupled between a second terminal of the second capacitor and a voltage amplifier output terminal. The second switch may be connected between the signal input terminal and the second terminal of the second capacitor.

According to another aspect of the embodiments, a voltage amplifier circuit may include a voltage clamp circuit. The voltage clamp circuit may provide an operating voltage to a voltage amplifier input terminal in response to a clamp signal.

According to another aspect of the embodiments, a voltage amplifier may include a first transistor and a load device. A first transistor may have a controllable impedance path disposed between a first reference potential and a voltage amplifier output terminal and may have a control terminal connected to a voltage amplifier input terminal. A load device may be disposed between a second reference potential and a voltage amplifier output terminal.

According to another aspect of the embodiments, a voltage amplifier circuit may have a gain that can be selectable among a plurality of gain values. A voltage amplifier circuit may include a voltage amplifier and a gain changing unit. A voltage amplifier may receive a voltage amplifier input signal at a voltage amplifier input terminal and may provide an amplified signal at a voltage amplifier output terminal. A gain changing unit may receive a signal input at a signal input terminal and a first gain changing signal at a first gain changing terminal and may provide a voltage amplifier input signal. The gain of the voltage amplifier circuit may be selectable by changing the value of a capacitance between the signal input terminal and the voltage amplifier input terminal.

According to another aspect of the embodiments, a gain changing unit may include a first capacitor, a second capacitor, a first switch, and a second switch. A first capacitor may have a first terminal connected to the signal input terminal and a second terminal connected to the voltage amplifier input terminal. A second capacitor may have a second terminal connected to the voltage amplifier input terminal. The first switch may be disposed between the signal input terminal and a first terminal of the second capacitor. The first switch may have a first switch high impedance state when the first gain changing signal is in a first low gain state. The first switch may have a first switch low impedance state when the first gain changing signal is in a first high gain state. The second switch may be disposed between a first potential and the first terminal of the second capacitor. The second switch may have a second switch low impedance state when the first gain changing signal is in a first low gain state. The second switch may have a second switch high impedance state when the first gain changing signal is in a first high gain state.

According to another aspect of the embodiments, a gain changing circuit may include a third capacitor, a third switch, and a fourth switch. The third capacitor may have a second terminal connected to the voltage amplifier input terminal. The third switch may be disposed between the signal input terminal and a first terminal of the third capacitor. The third switch may have a third switch high impedance state when a second gain changing signal is in a second low gain state. The third switch may have a third switch low impedance state when the second gain changing signal is in a second high gain state. The fourth switch may be disposed between a first potential and the first terminal of the third capacitor. The fourth switch may have a fourth switch low impedance state when the second gain changing signal is in a second low gain state. The fourth switch may have a fourth switch high impedance state when the second gain changing signal is in a second high gain state.

According to another aspect of the embodiments, the gain may be selectable among at least four gain values.

According to another aspect of the embodiments, a gain changing unit includes a first capacitor, a second capacitor, a first switch, and a second switch. The first capacitor may have a first terminal connected to the signal input terminal and a second terminal connected to the voltage amplifier input terminal. The second capacitor may have a second terminal connected to the voltage amplifier input terminal. The first switch may be disposed between the signal input terminal and a first terminal of the second capacitor. The first switch may have a first switch high impedance state when the first gain changing signal is in a first low gain state and a first switch low impedance state when the first gain changing signal is in a first high gain state. A second switch may be disposed between the voltage amplifier output terminal and the first terminal of the second capacitor. The second switch may have a second switch low impedance state when the first gain changing signal is in the first low gain state and a second switch high impedance state when the first gain changing signal is in the first high gain state.

According to another aspect of the embodiments, a voltage amplifier circuit may have a gain that can be selectable among a plurality of gain values. A voltage amplifier circuit may include a voltage amplifier and a gain changing unit. A voltage amplifier may receive a voltage amplifier input signal at a voltage amplifier input terminal and may provide an amplified signal at a voltage amplifier output terminal. A gain changing unit may receive a signal input at a signal input terminal and a first gain changing signal at a first gain changing terminal and may provide a voltage amplifier input signal. The gain of the voltage amplifier circuit may be selectable by changing the value of a capacitance between the signal input terminal and the voltage amplifier input terminal in response to the first gain changing signal.

According to another aspect of the embodiments, a gain changing unit may include a first capacitor, a second capacitor, a first insulated gate field effect transistor (IGFET), and a second IGFET. A first capacitor may have a first terminal connected to the signal input terminal and a second terminal connected to the voltage amplifier input terminal. A second capacitor may have a second terminal connected to the voltage amplifier input terminal. The first IGFET may be disposed between the signal input terminal and a first terminal of the second capacitor. The first IGFET may have a first IGFET high impedance state when the first gain changing signal is in a first low gain state. The first IGFET may have a first IGFET low impedance state when the first gain changing signal is in a first high gain state. The second IGFET may be disposed between a first potential and the first terminal of the second capacitor. The second IGFET may have a second IGFET low impedance state when the first gain changing signal is in a first low gain state. The second switch may have a second switch high impedance state when the first gain changing signal is in a first high gain state.

According to another aspect of the embodiments, a gain changing circuit may include a third capacitor, a third IGFET, and a fourth IGFET. The third capacitor may have a second terminal connected to the voltage amplifier input terminal. The third IGFET may be disposed between the signal input terminal and a first terminal of the third capacitor. The third IGFET may have a third IGFET high impedance state when a second gain changing signal is in a second low gain state. The third IGFET may have a third IGFET low impedance state when the second gain changing signal is in a second high gain state. The fourth IGFET may be disposed between a first potential and the first terminal of the third capacitor. The fourth IGFET may have a fourth IGFET low impedance state when the second gain changing signal is in a second low gain state. The fourth IGFET may have a fourth IGFET high impedance state when the second gain changing signal is in a second high gain state.

According to another aspect of the embodiments, the gain may be selectable among at least four gain values.

According to another aspect of the embodiments, a gain changing unit includes a first capacitor, a second capacitor, a first IGFET, and a second IGFET. The first capacitor may have a first terminal connected to the signal input terminal and a second terminal connected to the voltage amplifier input terminal. The second capacitor may have a second terminal connected to the voltage amplifier input terminal. The first IGFET may be disposed between the signal input terminal and a first terminal of the second capacitor. The first IGFET may have a first IGFET high impedance state when the first gain changing signal is in a first low gain state and a first IGFET low impedance state when the first gain changing signal is in a first high gain state. A second IGFET may be disposed between the voltage amplifier output terminal and the first terminal of the second capacitor. The second IGFET may have a second IGFET low impedance state when the first gain changing signal is in the first low gain state and a second IGFET high impedance state when the first gain changing signal is in the first high gain state.

According to another aspect of the embodiments, the voltage amplifier circuit may further include a voltage clamp IGFET having a voltage clamp impedance path disposed between a clamp potential and the voltage amplifier input terminal and a voltage clamp IGFET control terminal receiving a voltage clamp signal.

According to another aspect of the embodiments, a voltage amplifier may include an amplifying IGFET and a load IGFET. An amplifying IGFET may have a controllable impedance path disposed between a first potential and a voltage amplifier output terminal and may have a control terminal connected to a voltage amplifier input terminal. A load IGFET may be disposed between a second potential and a voltage amplifier output terminal.

DETAILED DESCRIPTION OF THE EMBODIMENTS

Various embodiments of the present invention will now be described in detail with reference to a number of drawings.

Figure 1:
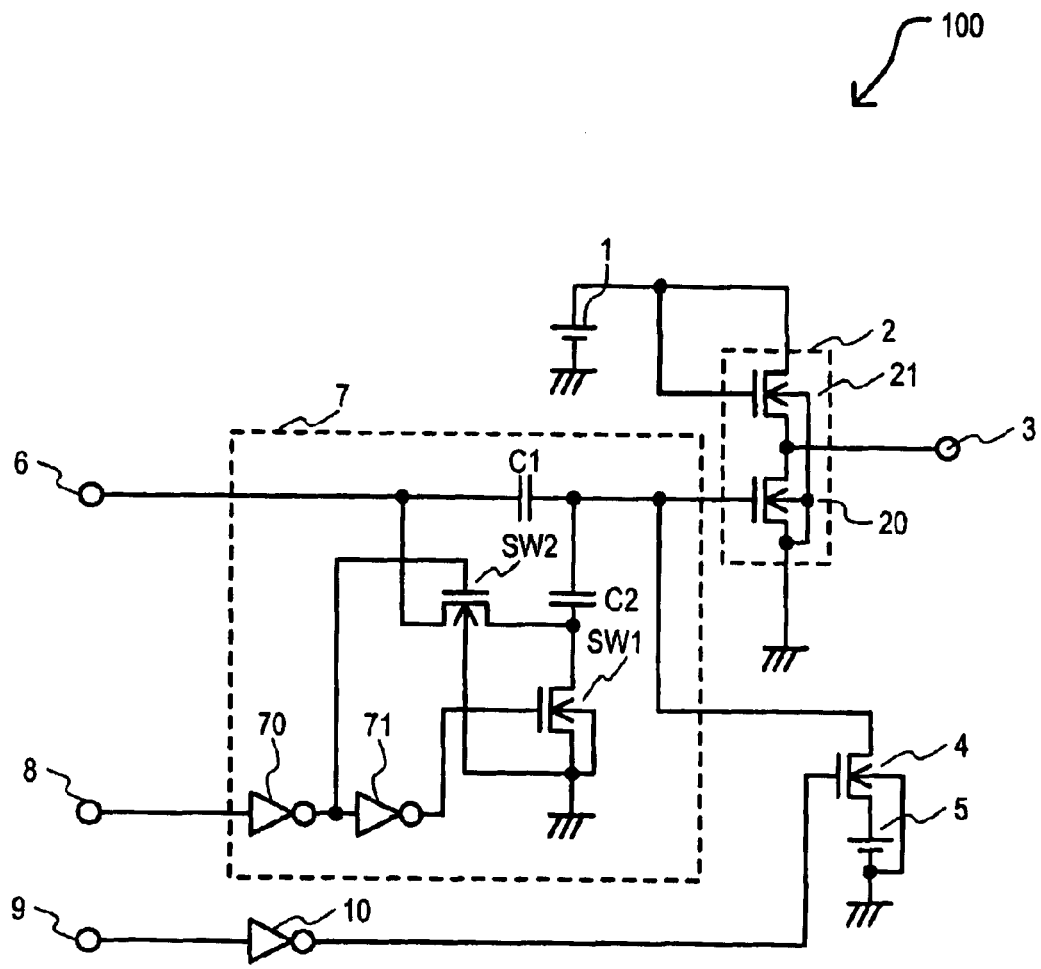
FIG. 1 is a circuit schematic diagram of a voltage amplifying circuit according to an embodiment.

Referring now to FIG. 1, a circuit schematic diagram of a voltage amplifying circuit according to an embodiment is set forth and given the general reference character 100.

Voltage amplifying circuit 100 may receive inputs at a signal input terminal 6, a gain changing terminal 8, and a clamp pulse input terminal 9 and provide an output at a signal output terminal 3. Voltage amplifying circuit 100 may include a power supply 1, a voltage amplifier 2, a voltage clamp switch 4, a clamp voltage source 5, a gain changing unit 7 and an inverter 10.

Clamp voltage source 5 may determine the operating point of voltage amplifier 2. Gain changing unit 7 may allow a gain of voltage amplifying circuit 100 to be changed.

Voltage amplifier 2 may include transistors (20 and 21). Transistor 20 may have a source connected to ground, a gate connected to receive an output from gain changing unit 7, and a drain connected to signal output terminal 3. Transistor 21 may have a source connected to signal output terminal 3 and a gate and drain connected to power supply 1. Transistors (20 and 21) may have back-gates connected to ground. Transistors (20 and 21) may be insulated gate field effect transistors (IGFETs) and more particularly may be n-type MOSFETs (metal oxide semiconductor field effect transistors). Transistor 21 may be used as a resistor or a load device for voltage amplifier 2.

Figure 2:
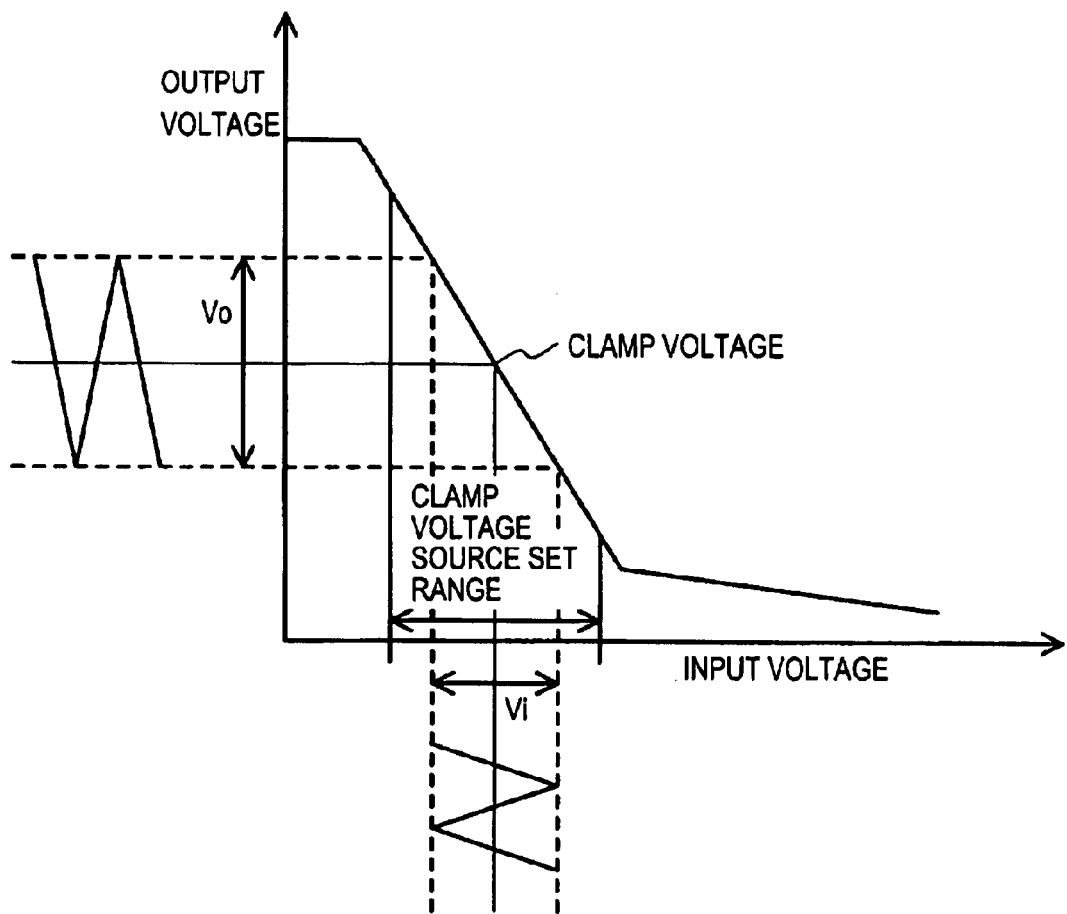
FIG. 2 is a graph illustrating transfer characteristics of a voltage amplifier.

Voltage amplifier 2 may operate as an inversion amplifier. Referring now to FIG. 2, a graph illustrating transfer characteristics of voltage amplifier 2 is set forth. FIG. 2 may also illustrate an input waveform Vi and an output waveform Vo of voltage amplifier 2 for a case where the voltage of clamp voltage source 5 is set within a clamp voltage source range. The voltage gain (gain) of voltage amplifier 2 may be obtained as Vo/Vi where Vo is an input voltage and Vo is an output voltage.

Voltage clamp switch 4 may have an input connected to clamp voltage source 5, a control terminal connected to receive an output from inverter 10, and an output connected to a gate of transistor 20 in voltage amplifier 2. Voltage clamp switch 4 may be an IGFET, such as an n-type MOSFET, for example. Voltage clamp switch 4 may have a back-gate connected to ground. Inverter 10 may have an input connected to clamp pulse input terminal 9. Voltage clamp switch 4 may turn off when voltage amplifying circuit 100 is being used as an amplifier and may be turned on when setting the operating voltage of voltage amplifier 2.

Gain changing unit 7 may include inverters (70 and 71), switches (SW1 and SW2) and capacitors (C1 and C2). Capacitor C1 may have a first terminal connected to signal input terminal 6 and a second terminal connected to a gate of transistor 20 in voltage amplifier 2. Inverter 70 may have an input connected to gain changing terminal 8 and an output connected to an input of inverter 71 and a control terminal of switch SW2. Inverter 71 may have an output connected to a control terminal of switch SW1. Switch SW1 may have a source-drain path between ground and a first terminal of capacitor C2. Switch SW2 may have a source-drain path between a signal input terminal 6 and a first terminal of capacitor C2. Capacitor C2 may have a second terminal connected to the second terminal of capacitor C1 and a gate of transistor 20 in voltage amplifier 2. Switches (SW1 and SW2) may be IGFETs, such as n-type MOSFETs, for example. Switches (SW1 and SW2) may have back-gates connected to ground.

The operating voltage of voltage amplifier 2 (the voltage of clamp voltage source 5) may be set in order to allow voltage amplifier 2 to operate within a linear amplifying range. This operating voltage of voltage amplifier 2 may be set in consideration of a waveform and magnitude of a signal that is input to voltage amplifier 2. The operating voltage may be set within a clamp voltage source set range illustrated in FIG. 2. Thus, the operating voltage may normally be set in a range where voltage amplifier 2 operates as an inversion amplifier as illustrated in the area of essentially constant slope in the graph of the transfer characteristics as illustrated in FIG. 2.

A signal voltage applied to gain changing terminal 8 may select a higher gain or a lower gain for voltage amplifying circuit 100. When a high voltage (such as 5 volts) is applied to gain changing terminal 8, inverter 70 may apply a low potential to a control terminal of switch SW2 and switch SW2 may be turned off. Also, inverter 71 may apply a high potential to a control terminal of switch SW1 and switch SW1 may be turned on. With switch SW1 turned on, capacitor C2 may have a first terminal connected to ground (through switch SW1). In this way, the gain of voltage amplifying circuit 100 may be a lower gain. When a low voltage (such as 0 volts) is applied to gain changing terminal 8, inverter 70 may apply a high potential to a control terminal of switch SW2 and switch SW2 may be turned on. Also, inverter 71 may apply a low potential to a control terminal of switch SW1 and switch SW1 may be turned off. With switch SW2 turned on, capacitor C2 may have a first terminal connected to signal input terminal 6 (through switch SW2) and may thus be connected in parallel with capacitor C1. In this way, the gain of voltage amplifying circuit 100 may be a higher gain.

Capacitor C2 may be used to change the gain of voltage amplifying circuit 100. The changing of the gain may be accomplished by connecting capacitor C2 either in parallel with capacitor C1 or between the gate of transistor 20 and ground.

Gate lengths and channel widths of transistors (20 and 21) may be changed in order to design the gain and operating speed of voltage amplifier 2 to the desired values. When the channel width of transistor 20 is set larger and the gate length of transistor 20 is set smaller, the gain of voltage amplifier 2 may become larger. Also, the channel width of transistor 21 is set larger and the gate length of transistor 21 is set smaller, the gain of voltage amplifier 2 may become smaller. However, in this case, current may increase and the operating speed of voltage amplifier may become higher.

The gain and the operating speed may be determined in accordance with the ratio of sizes and basic characteristics of transistors (20 and 21). A simulation tool, such as SPICE (simulation program with integrated circuit emphasis) may be used to determine gain and operating speed in the design phase.

An operation of selecting or changing the gain of voltage amplifying circuit 100 will now be described.

Figure 3:
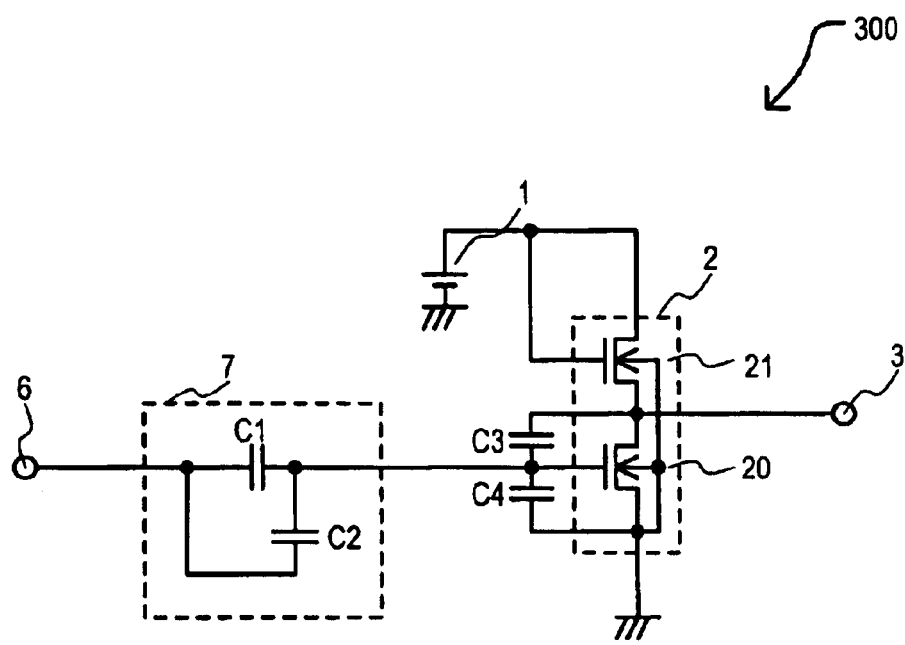
FIG. 3 is a simplified circuit diagram illustrating a case where a voltage amplifying circuit of FIG. 1 has a higher gain according to an embodiment.

Referring now to FIG. 3, a simplified circuit diagram illustrating a case where voltage amplifying circuit 100 has a higher gain according to an embodiment is set forth and given the general reference character 300. The circuit diagram 300 of FIG. 3 may illustrate a case where gain changing terminal 8 (FIG. 1) receives a low voltage (0 volts). In the circuit diagram 300 of FIG. 3, switches (SW1 and SW2) and inverters (70 and 71) of gain changing unit 7 are omitted. Also, voltage clamp switch 4, voltage clamp source 5, and inverter 10 are omitted.

In FIG. 3, signal input terminal 6 may be connected to a gate of transistor 20 through parallel connected capacitors (C1 and C2). It is assumed here that the gate voltage of transistor 20 has been clamped in the operating range of voltage amplifier 2 before an input signal is applied to signal input terminal 6.

In FIG. 3, capacitors (C3 and C4) may be parasitic capacitance between the gate and drain and between the gate and source, respectively, of transistor 20. Assuming that the d.c. gain of voltage amplifier 2 is "a", the gain B from signal input terminal 6 to signal output terminal 3 may be approximately represented by the following expression (1).

$$B = a \times (C4 + a \times C3 + C1 + C2)/(a \times C3 + C4) \quad (1)$$

Figure 4:
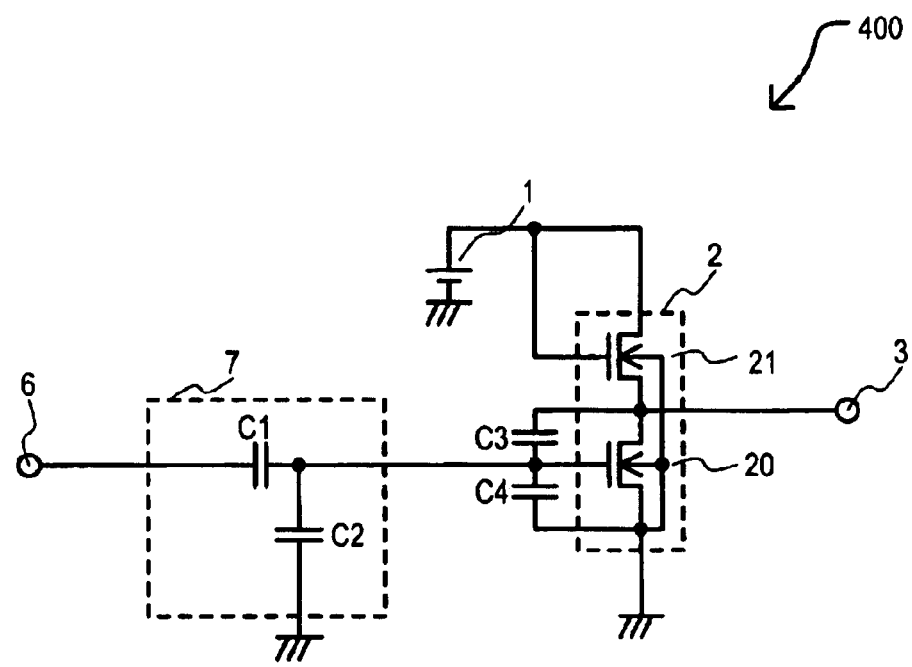
FIG. 4 is a simplified circuit diagram illustrating a case where a voltage amplifying circuit of FIG. 1 has a lower gain according to an embodiment.

Referring now to FIG. 4, a simplified circuit diagram illustrating a case where voltage amplifying circuit 100 has a lower gain according to an embodiment is set forth and given the general reference character 400. The circuit diagram 400 of FIG. 4 may illustrate a case where gain changing terminal 8 (FIG. 1) receives a high voltage (5 volts). In the circuit diagram 400 of FIG. 4, switches (SW1 and SW2) and inverters (70 and 71) of gain changing unit 7 are omitted. Also, voltage clamp switch 4, voltage clamp source 5, and inverter 10 are omitted.

In FIG. 4, signal input terminal 6 may be connected to a gate of transistor 20 through capacitor C1. Also, capacitor C2 may be connected between the gate of transistor 20 and ground. It is assumed here that the gate voltage of transistor 20 has been clamped in the operating range of voltage amplifier 2 before an input signal is applied to signal input terminal 6.

In FIG. 4, capacitors (C3 and C4) may be parasitic capacitance between the gate and drain and between the gate and source, respectively, of transistor 20. Assuming that the d.c. gain of voltage amplifier 2 is "a", the gain B' from signal input terminal 6 to signal output terminal 3 may be approximately represented by the following expression (2).

$$B' = a \times (C4 + a \times C3 + C1 + C2)/(a \times C3 + C4 + C2) \quad (2)$$

The actual gains (B and B') may be designed by using a circuit simulation tool such as SPICE. In order to obtain a gain variation ratio of B:B'≈4:1, a gate length (L) of transistor 20 is approximately 4 $\mu$m, a channel width (W) of transistor 20 is approximately 400 $\mu$m, L of transistor 21 is approximately 5 $\mu$m, W of transistor 21 is approximately 25 $\mu$m, C1 is approximately 1.5 pF, and C2 is approximately 4.5 pF. In order to reduce the gain variation ratio, capacitor C2 may be set to a smaller value and/or capacitor C1 may be set to a larger value.

Figure 5:
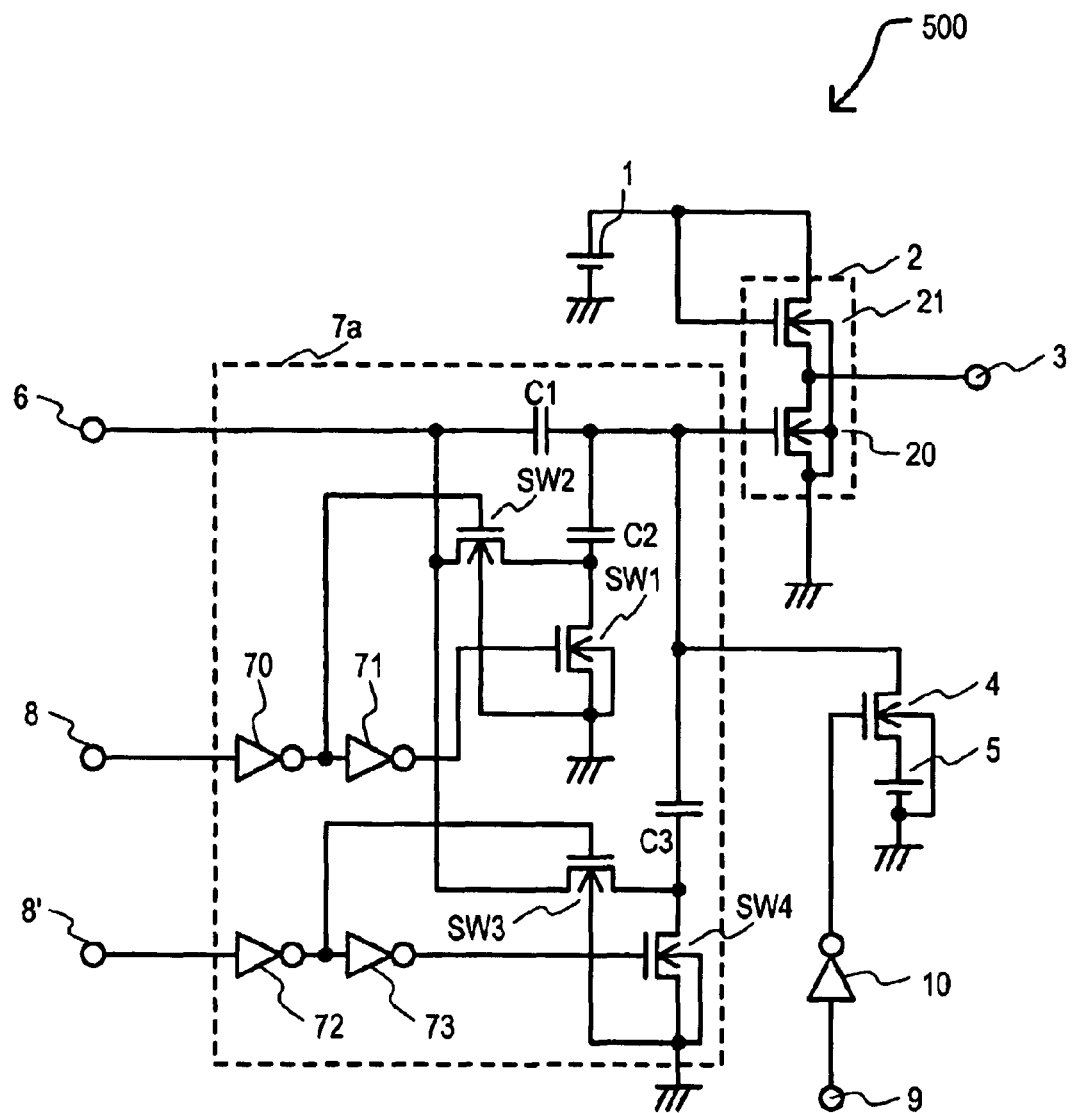
FIG. 5 is a circuit schematic diagram of a voltage amplifying circuit according to an embodiment.

Referring now to FIG. 5, a circuit schematic diagram of a voltage amplifying circuit according to an embodiment is set forth and given the general reference character 500. Voltage amplifying circuit 500 may include similar constituents as voltage amplifier circuit 100 which may be referred to by the same reference character.

Voltage amplifying circuit 500 may receive inputs at a signal input terminal 6, gain changing terminals (8 and 8'), and a clamp pulse input terminal 9 and provide an output at a signal output terminal 3. Voltage amplifying circuit 500 may include a power supply 1, a voltage amplifier 2, a voltage clamp switch 4, a clamp voltage source 5, a gain changing unit 7a and an inverter 10.

Voltage amplifying circuit 500 may differ from voltage amplifying circuit 100 (FIG. 1) in that a gain changing unit 7a may differ from gain changing unit 7 (FIG. 1). Gain changing unit 7a may include capacitors (C1 to C3), switches (SW1 to SW4), and inverters (70 to 73). Capacitor C1 may have a first terminal connected to signal input terminal 6 and a second terminal connected to a gate of transistor 20 in voltage amplifier 2. Inverter 70 may have an input connected to gain changing terminal 8 and an output connected to an input of inverter 71 and a control terminal of switch SW2. Inverter 71 may have an output connected to a control terminal of switch SW1. Switch SW1 may have a source-drain path between ground and a first terminal of capacitor C2. Switch SW2 may have a source-drain path between a signal input terminal 6 and a first terminal of capacitor C2. Capacitor C2 may have a second terminal connected to the second terminal of capacitor C1 and a gate of transistor 20 in voltage amplifier 2. Inverter 72 may have an input connected to gain changing terminal 8' and an output connected to an input of inverter 73 and a control terminal of switch SW3. Inverter 73 may have an output connected to a control terminal of switch SW4. Switch SW4 may have a source-drain path between ground and a first terminal of capacitor C3. Switch SW3 may have a source-drain path between a signal input terminal 6 and a first terminal of capacitor C3. Capacitor C3 may have a second terminal connected to the second terminal of capacitor C1 and a gate of transistor 20 in voltage amplifier 2. Switches (SW1 to SW4) may be IGFETs, such as n-type MOSFETs, for example. Switches (SW1 to SW4) may have back-gates connected to ground.

In gain changing unit 7a, switches (SW1 and SW2), capacitors (C1 and C2), and inverters (70 and 71) may be conceptualized as a first gain changing circuit. Switches (SW3 and SW4), capacitors (C3 and C4), and inverters (72 and 73) may be conceptualized as a second gain changing circuit.

In voltage amplifying circuit 500 the gain may be selectable among four different values.

When a high voltage (such as 5 volts) is applied to gain changing terminals (8 and 8'), switches (SW2 and SW3) may turn off and switches (SW1 and SW4) may turn on. Capacitors (C2 and C3) may each be connected between the gate of transistor 20 and ground. In this way, voltage amplifying circuit 500 may provide a first gain. The first gain may be the lowest gain provided by voltage amplifying circuit 500.

When a high voltage (such as 5 volts) is applied to gain changing terminal 8 and a low voltage (such as 0 volts) is applied to gain changing terminal 8', switches (SW2 and SW4) may turn off and switches (SW1 and SW3) may turn on. Capacitor C3 may be connected in parallel with capacitor C1 and capacitor C2 may be connected between the gate of transistor 20 and ground. In this way, voltage amplifying circuit 500 may provide a second gain.

When a low voltage (such as 0 volts) is applied to gain changing terminal 8 and a high voltage (such as 5 volts) is applied to gain changing terminal 8', switches (SW1 and SW3) may turn off and switches (SW2 and SW4) may turn on. Capacitor C2 may be connected in parallel with capacitor C1 and capacitor C3 may be connected between the gate of transistor 20 and ground. In this way, voltage amplifying circuit 500 may provide a third gain.

When a low voltage (such as 0 volts) is applied to gain changing terminals (8 and 8'), switches (SW1 and SW4) may turn off and switches (SW2 and SW3) may turn on. Capacitors (C2 and C3) may each be connected in parallel with capacitor C1. In this way, voltage amplifying circuit 500 may provide a fourth gain. The fourth gain may be the highest gain provided by voltage amplifying circuit 500.

In this way, voltage amplifying circuit 500 may selectively arrange capacitors (C1 to C3) so that the gain may be selectable among four different gain values.

Figure 6:
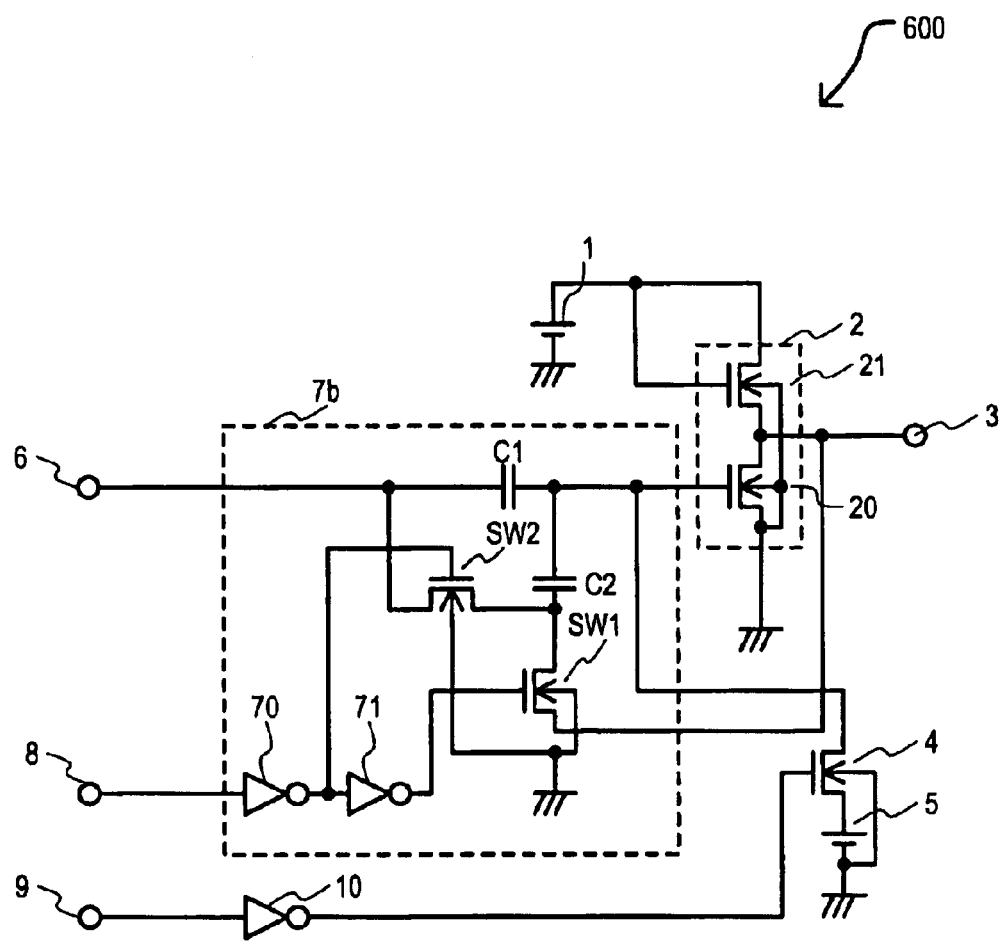
FIG. 6 is a circuit schematic diagram of a voltage amplifying circuit according to an embodiment.
Figure 7:
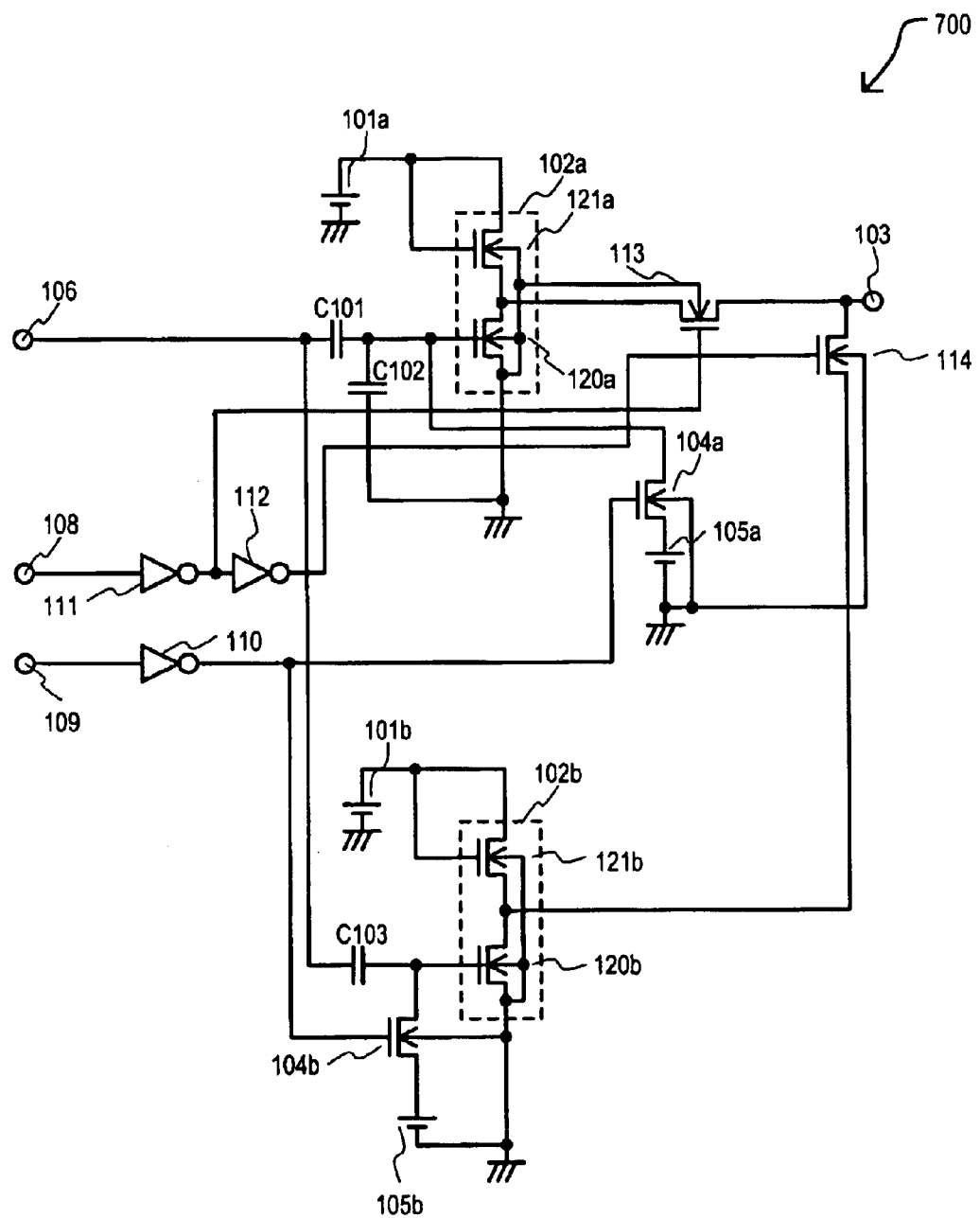
FIG. 7 is a circuit schematic diagram of a conventional voltage amplifying circuit.
Figure 8:
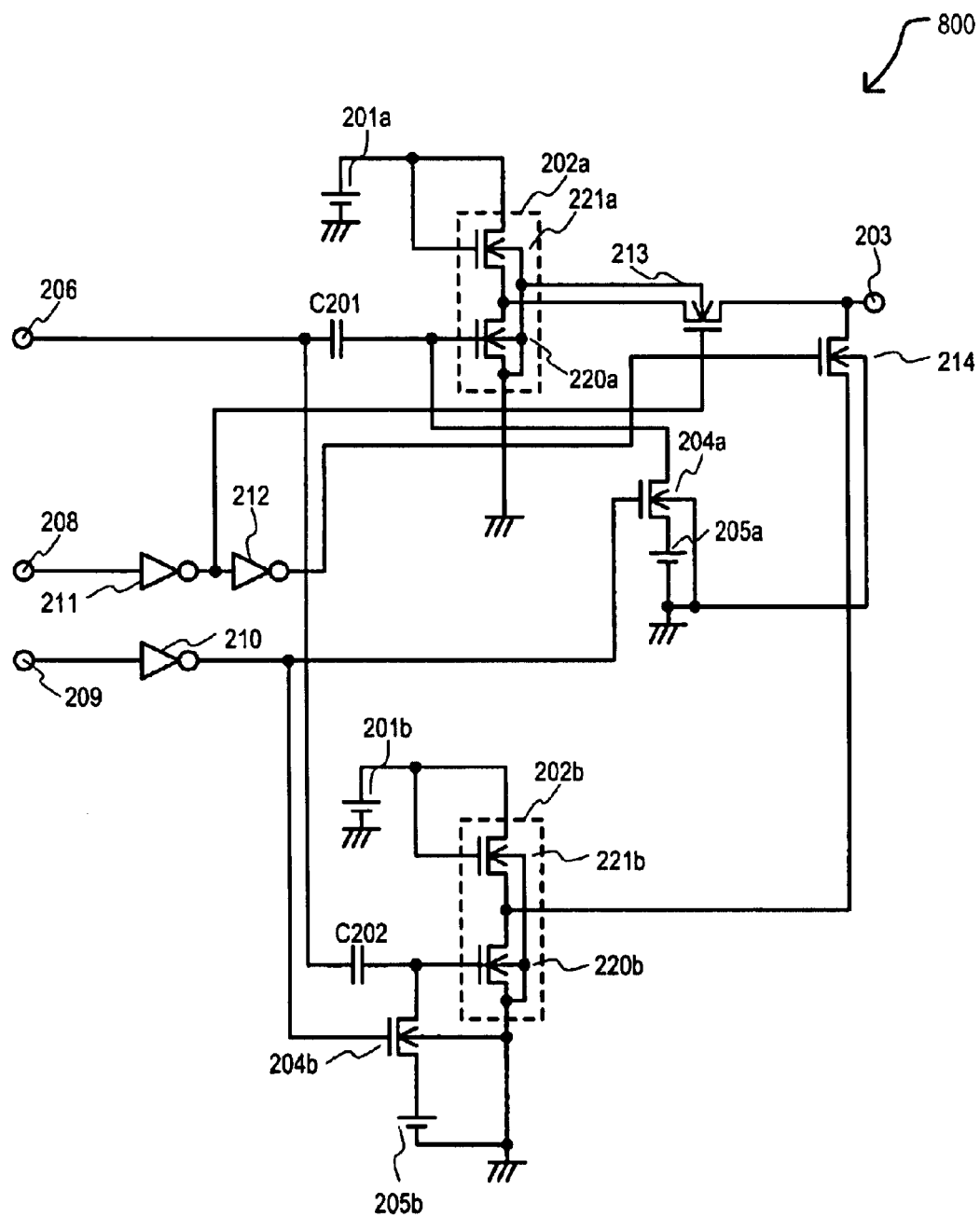
FIG. 8 is a circuit schematic diagram of a conventional voltage amplifying circuit.
Figure 9:
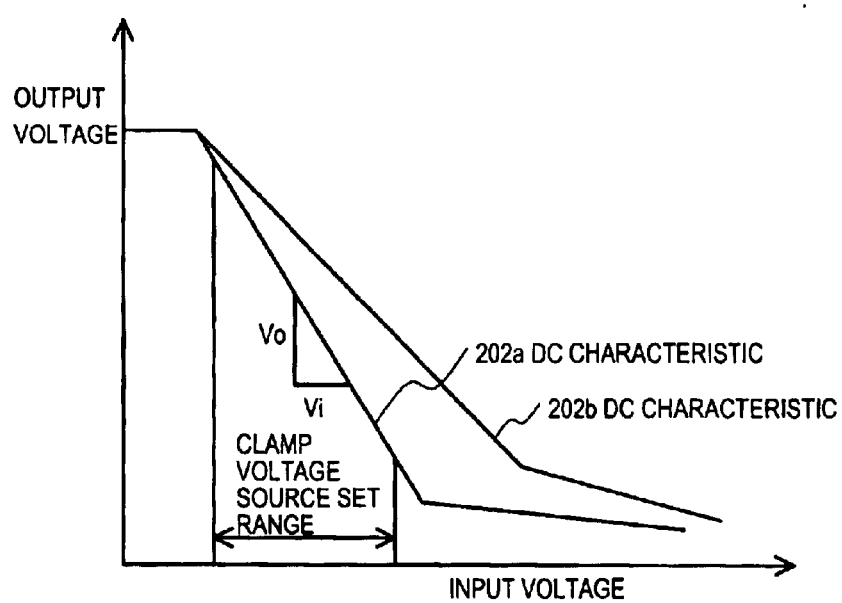
FIG. 9 is a graph illustrating voltage transfer characteristics of voltage amplifiers (202a and 202b) of FIG. 8.
Figure 10:
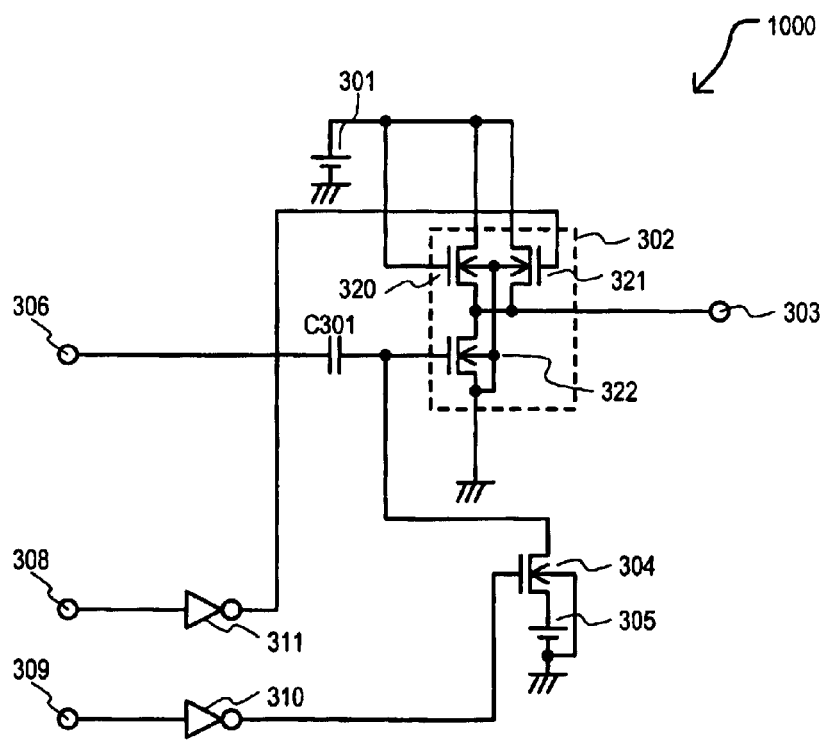
FIG. 10 is a circuit schematic diagram of yet another conventional voltage amplifying circuit.

Referring now to FIG. 6, a circuit schematic diagram of a voltage amplifying circuit according to an embodiment is set forth and given the general reference character 600. Voltage amplifying circuit 600 may include similar constituents as voltage amplifier circuit 100 which may be referred to by the same reference character.

Voltage amplifying circuit 600 may receive inputs at a signal input terminal 6, a gain changing terminal 8, and a clamp pulse input terminal 9 and provide an output at a signal output terminal 3. Voltage amplifying circuit 600 may include a power supply 1, a voltage amplifier 2, a voltage clamp switch 4, a clamp voltage source 5, a gain changing unit 7b and an inverter 10.

Voltage amplifying circuit 600 may differ from voltage amplifying circuit 100 (FIG. 1) in that a gain changing unit 7b may differ from gain changing unit 7 (FIG. 1). Gain changing unit 7b may include inverters (70 and 71), switches (SW1 and SW2) and capacitors (C1 and C2). Capacitor C1 may have a first terminal connected to signal input terminal 6 and a second terminal connected to a gate of transistor 20 in voltage amplifier 2. Inverter 70 may have an input connected to gain changing terminal 8 and an output connected to an input of inverter 71 and a control terminal of switch SW2. Inverter 71 may have an output connected to a control terminal of switch SW1. Switch SW1 may have a source-drain path between signal output terminal 3 and a first terminal of capacitor C2. Switch SW2 may have a source-drain path between a signal input terminal 6 and a first terminal of capacitor C2. Capacitor C2 may have a second terminal connected to the second terminal of capacitor C1 and a gate of transistor 20 in voltage amplifier 2. Switches (SW1 and SW2) may be IGFETs, such as n-type MOSFETs, for example. Switches (SW1 and SW2) may have back-gates connected to ground.

A signal voltage applied to gain changing terminal 8 may select a higher gain or a lower gain for voltage amplifying circuit 600. When a high voltage (such as 5 volts) is applied to gain changing terminal 8, inverter 70 may apply a low potential to a control terminal of switch SW2 and switch SW2 may be turned off. Also, inverter 71 may apply a high potential to a control terminal of switch SW1 and switch SW1 may be turned on. With switch SW1 turned on, capacitor C2 may have a first terminal connected to signal output terminal 3 (through switch SW1). In this way, the gain of voltage amplifying circuit 600 may be a lower gain. When a low voltage (such as 0 volts) is applied to gain changing terminal 8, inverter 70 may apply a high potential to a control terminal of switch SW2 and switch SW2 may be turned on. Also, inverter 71 may apply a low potential to a control terminal of switch SW1 and switch SW1 may be turned off. With switch SW2 turned on, capacitor C2 may have a first terminal connected to signal input terminal 6 (through switch SW2) and may thus be connected in parallel with capacitor C1. In this way, the gain of voltage amplifying circuit 600 may be a higher gain.

Voltage amplifying circuit 600 may have a wider gain variation between the lower gain and the higher gain than voltage amplifying circuit 100. This may be accomplished by utilizing a phenomenon (Miller effect) that the apparent capacitance of capacitor C2 may become larger by essentially an amount corresponding to the gain of voltage amplifier 2 when the first node of capacitor C2 is connected to signal output terminal 3 (at the time of the lower gain).

In voltage amplifying circuits according to the embodiments, transistors (20 and 21), voltage clamp switch 4, and switches (SW1 to SW4) may be n-type MOS transistors, however, p-type MOS transistors may be used, as just one example. In particular, if one of switches (SW1 or SW2) is a p-type MOS transistor while the other one of switches (SW1 or SW2) is an n-type MOS transistor, inverters (70 and 71) may not be required. In such a case, control terminals of switches (SW1 and SW2) may be connected directly to gain changing terminal 8. Likewise, if in voltage amplifying circuit 500, if one of switches (SW3 or SW4) is a p-type MOS transistor while the other one of switches (SW3 or SW4) is an n-type MOS transistor, inverters (72 and 73) may not be required. In such a case, control terminals of switches (SW3 and SW4) may be connected directly to gain changing terminal 8'.

According to the embodiments, a gain changing unit may be included in a voltage amplifying circuit. A gain changing unit may change at least one of: a capacitance between a signal input terminal and an input terminal of a voltage amplifier, the capacitance between an input terminal of a voltage amplifier and a ground (or reference potential). In this way, the gain (gain from a signal input terminal to an output terminal) of a voltage amplifier of a voltage amplifying circuit may be changed. Because it may not be necessary to provide two voltage amplifiers as in a conventional approach, the circuit area required and power consumption in a voltage amplifying circuit may be reduced in comparison.

Also, by using the same voltage amplifier while providing selectable gains, operating speed variations between differing gains may be reduced. In a conventional voltage amplifying circuit, two voltage amplifiers having differing gains may be included and may be switched in accordance with a desired gain. However, it may be difficult to provide two voltage amplifiers with the same operating speed. In comparison, according to the embodiments, because only one voltage amplifier may be used, even if the gain is changed, the operation speed may remain essentially the same.

Also, according to the embodiments, the range of variation of the gain may be increased. An increased variation of gain may be accomplished because the gain may be changed with selectable configuration of capacitors instead of, for example, changing a current value flowing in a voltage amplifier as in a conventional voltage amplifying circuit. Furthermore, by changing a gain by changing a configuration of capacitors, freedom of design may be enhanced.

Also, according to the embodiments, variations in power consumption may be reduced. In a conventional voltage amplifying circuit, a method may be used to increase current flowing in a load of a voltage amplifier in order to reduce gain. However, according to the embodiments, the gain of a voltage amplifier may be fixed. In this way, variations in power consumption when a gain is changed may be reduced.

A gain changing unit may include first through third capacitors and first to fourth switches. By doing so, a voltage amplifying circuit may include four different selectable gains.

According to the embodiments, a gain changing unit may include a first capacitor disposed between a signal input terminal and an input terminal of a voltage amplifier, a second capacitor having a terminal connected to an input terminal of the voltage amplifier and a terminal of the first capacitor, a first switch may have one terminal connected to another end of the second capacitor and another terminal connected to an output terminal of a voltage amplifier, and a second switch may have one terminal connected to a signal input terminal and another terminal connected to another terminal of the second capacitor. In this way, the variation of the gain may be increased.

It is understood that the embodiments described above are exemplary and the present invention should not be limited to those embodiments. Specific structures should not be limited to the described embodiments.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A voltage amplifier circuit, comprising:
   a voltage amplifier that amplifies an input signal received at a voltage amplifier input terminal and providing an output signal at a voltage amplifier output terminal; and
   a gain changing circuit that changes at least one of the group consisting of a first capacitance value between a signal input terminal and the voltage amplifier input terminal, and a second capacitance value between the voltage amplifier input terminal and a first reference potential, wherein
   the gain changing unit includes
      a first capacitor, that provides at least a portion of the first capacitance value, having a first terminal coupled to the signal input terminal and a second terminal coupled to the voltage amplifier input terminal;
      a second capacitor, that provides at least a portion of the first or second capacitance value, having a third terminal coupled to the voltage amplifier input terminal;
      a first switch coupled between a fourth terminal of the second capacitor and the first reference potential; and
      a second switch coupled between the signal input terminal and the fourth terminal.

2. A voltage amplifier circuit, comprising:
   a voltage amplifier that amplifies an input signal received at a voltage amplifier input terminal and providing an output signal at a voltage amplifier output terminal; and
   a gain changing circuit that changes at least one of the group consisting of a first capacitance value between a signal input terminal and the voltage amplifier input terminal, and a second capacitance value between the voltage amplifier input terminal and a first reference potential, wherein
   the gain changing unit includes
      a first capacitor, that provides at least a portion of the first capacitance value, having a first terminal coupled to the signal input terminal and a second terminal coupled to the voltage amplifier input terminal;
      a second capacitor, that provides at least a portion of the first or second capacitance value, having a third terminal coupled to the voltage amplifier input terminal and a fourth terminal;
      a third capacitor, that provides at least a portion of the first or second capacitance value, having a fifth terminal coupled to the voltage amplifier input terminal and a sixth terminal;
      a first switch coupled between the fourth terminal and the first reference potential;
      a second switch coupled between the signal input terminal and the fourth terminal;
      a third switch coupled between the signal input terminal and the sixth terminal; and
      a fourth switch coupled between the sixth terminal and the first reference potential.

3. A voltage amplifier circuit, comprising:
   a voltage amplifier that amplifies an input signal received at a voltage amplifier input terminal and providing an output signal at a voltage amplifier output terminal; and
   a gain changing circuit that changes at least one of the group consisting of a first capacitance value between a signal input terminal and the voltage amplifier input terminal, and a second capacitance value between the voltage amplifier input terminal and a first reference potential, wherein
   the gain changing unit includes
      a first capacitor, that provides at least a portion of the first capacitance value, having a first terminal coupled to the signal input terminal and a second terminal coupled to the voltage amplifier input terminal;
      a second capacitor, that provides at least a portion of the first capacitance value, having a third terminal coupled to the voltage amplifier input terminal and a fourth terminal;
      a first switch coupled between the fourth terminal and the voltage amplifier output terminal; and
      a second switch coupled between the signal input terminal and the fourth terminal.

4. A voltage amplifier circuit having a gain value selectable from among a plurality of gain values, comprising:
   a voltage amplifier coupled to receive a voltage amplifier input signal at a voltage amplifier input terminal and provide an amplified signal at a voltage amplifier output terminal; and
   a gain changing unit coupled to receive a signal input at a signal input terminal and a first gain changing signal at a first gain changing terminal and provide the voltage amplifier input signal wherein the gain value of the voltage amplifier circuit is selectable by changing a capacitance value between the signal input terminal and the voltage amplifier imput terminal, wherein
   the gain changing unit includes
      a first capacitor, that provides at least a portion of the capacitance value, having a first terminal coupled to the signal input terminal and a second terminal coupled to the voltage amplifier input terminal;
      a second capacitor having a third terminal coupled to the voltage amplifier input terminal and a fourth terminal;
      a first switch coupled between the signal input terminal and the fourth terminal and having a first switch high impedance state when the first gain changing signal is in a first low gain state and having a first switch low impedance state when the first gain changing signal is in a first high gain state; and
      a second switch coupled between a first potential and the fourth terminal and having a second switch low impedance state when the first gain changing signal is in the first low gain state and having a second switch high impedance state when the first gain changing signal is in the first high gain state.

5. The voltage amplifier circuit according to claim 4, wherein:

the gain changing unit further includes
a third capacitor having a fifth terminal coupled to the voltage amplifier input terminal and a sixth terminal;
a third switch coupled between the signal input terminal and the sixth terminal and having a third switch high impedance state when a second gain changing signal is in a second low gain state and having a third switch low impedance state when the second gain changing signal is in a second high gain state; and
a fourth switch coupled between the first potential and the sixth terminal and having a fourth switch low impedance state when the second gain changing signal is in the second low gain state and having a fourth switch high impedance state when the second gain changing signal is in the second high gain state.

6. The voltage amplifier circuit according to claim 5, wherein:
the gain value is selectable from among at least four gain values.

7. A voltage amplifier circuit having a gain value selectable from among a plurality of gain values, comprising:
a voltage amplifier coupled to receive a voltage amplifier input signal at a voltage amplifier input terminal and provide an amplified signal at a voltage amplifier output terminal; and
a gain changing unit coupled to receive a signal input at a signal input terminal and a first gain changing signal at a first gain changing terminal and provide the voltage amplifier input signal wherein the gain value of the voltage amplifier circuit is selectable by changing a capacitance value between the signal input terminal and the voltage amplifier input terminal, wherein
the gain changing unit includes
a first capacitor, that provides at least a portion of the capacitance value, having a first terminal coupled to the signal input terminal and a second terminal coupled to the voltage amplifier input terminal;
a second capacitor having a third terminal coupled to the voltage amplifier input terminal and a fourth terminal;
a first switch coupled between the signal input terminal and the fourth terminal and having a first switch high impedance state when the first gain changing signal is in a first low gain state and having a first switch low impedance state when the first gain changing signal is in a first high gain state; and
a second switch coupled between the voltage amplifier output terminal and the fourth terminal and having a second switch low impedance state when the first gain changing signal is in the first low gain state and having a second switch high impedance state when the first gain changing signal is in the first high gain state.

8. A voltage amplifier circuit having a gain value selectable from among a plurality of gain values, comprising:
a voltage amplifier coupled to receive a voltage amplifier input signal at a voltage amplifier input terminal and provide an amplified signal at a voltage amplifier output terminal; and
a gain changing unit coupled to receive a signal input at a signal imput terminal and a first lain changing signal at a first gain changing terminal and provide the voltage amplifier input signal wherein the gain value of the voltage amplifier circuit is selectable by changing a capacitance value between the signal input terminal and the voltage amplifier input terminal in response to the first gain changing signal; and a voltage clamp circuit coupled to the voltage amplifier input terminal and providing a clamp voltage in response to a clamp signal.

9. A voltage amplifier circuit having a gain value selectable from among a plurality of gain values, comprising:
a voltage amplifier coupled to receive a voltage amplifier input signal at a voltage amplifier input terminal and provide an amplified signal at a voltage amplifier output terminal; and
a gain changing unit coupled to receive a signal input at a signal input terminal and a first gain changing signal at a first gain changing terminal and provide the voltage amplifier input signal wherein the gain value of the voltage amplifier circuit is selectable by changing the value of a capacitance between the signal input terminal and the voltage amplifier input terminal in response to the first gain changing signal, wherein
the gain changing unit includes
a first capacitor, that provides at least a portion of the capacitance value, having a first terminal coupled to the signal input terminal and a second terminal coupled to the voltage amplifier input terminal;
a second capacitor having a third terminal coupled to the voltage amplifier input terminal and a fourth terminal;
a first insulated gate field effect transistor (IGFET) coupled between the signal input terminal and the fourth terminal and having a first IGFET high impedance state when the first gain changing signal is in a first low gain state and having a first IGFET low impedance state when the first gain changing signal is in a first high gain state; and
a second IGFET coupled between a first potential and the fourth terminal and having a second IGFET low impedance state when the first gain changing signal is in the first low gain state and having a second IGFET high impedance state when the first gain changing signal is in the first high gain state.

10. The voltage amplifier circuit according to claim 9, wherein:
the gain changing unit further includes
a third capacitor having a fifth terminal coupled to the voltage amplifier input terminal and a sixth terminal;
a third IGFET coupled between the signal input terminal and the sixth terminal and having a third IGFET high impedance state when a second gain changing signal is in a second low gain state and having a third IGFET low impedance state when the second gain changing signal is in a second high gain state; and
a fourth IGFET coupled between the first potential and the sixth terminal and having a fourth IGFET low impedance state when the second gain changing signal is in the second low gain state and having a fourth IGFET high impedance state when the second gain changing signal is in the second high gain state.

11. The voltage amplifier circuit according to claim 10, wherein:
the gain value is selectable from among at least four gain values.

12. A voltage amplifier circuit having a gain value selectable from among a plurality of gain values, comprising:
a voltage amplifier coupled to receive a voltage amplifier input signal at a voltage amplifier input terminal and provide an amplified signal at a voltage amplifier output terminal; and
a gain changing unit coupled to receive a signal input at a signal input terminal and a first gain changing signal at a first gain changing terminal and provide the voltage amplifier input signal wherein the gain value of the voltage amplifier circuit is selectable by changing the value of a capacitance between the signal input terminal and the voltage amplifier input terminal in response to the first gain changing signal, wherein the gain changing unit includes
- a first capacitor, that provides at least a portion of the capacitance value, having a first terminal coupled to the signal input terminal and a second terminal coupled to the voltage amplifier input terminal;
- a second capacitor having a third terminal coupled to the voltage amplifier input terminal and a fourth terminal;
- a first insulated gate field effect transistor (IGFET) coupled between the signal input terminal and the fourth terminal and having a first IGFET high impedance state when the first gain changing signal is in a first low gain state and having in a first IGFET low impedance state when the first gain changing signal is in a first high gain state; and
- a second IGFET coupled between the voltage amplifier output terminal and the fourth terminal and having a second IGFET low impedance state when the first gain changing signal is in the first low gain state and having a second IGFET high impedance state when the first gain changing signal is in the first high gain state.

13. A voltage amplifier circuit having a gain value selectable from among a plurality of gain values, comprising:

- a voltage amplifier coupled to receive a voltage ampliflier input signal at a voltage amplifier input terminal and provide an amplified signal at a voltage amplifier output terminal; and
- a gain changing unit coupled to receive a signal input at a signal input terminal and a first gain changing signal at a first gain changing terminal and provide the voltage ampliflier input signal wherein the gain value of the voltage amplifier circuit is selectable by changing the value of a capacitance between the signal input terminal and the voltage amplifier input terminal in response to the first gain changing signal; and
- a voltage clamp IGEET having a voltage clamp impedance path coupled between a clamp potential and the voltage amplifier input terminal and having a voltage clamp IGFET control terminal coupled to receive a voltage clamp signal.

* * * * *